United States Patent
Probst (10) Patent No.: US 9,082,796 B2
(45) Date of Patent: Jul. 14, 2015

(54) PROCESS DEVICE FOR PROCESSING IN PARTICULAR STACKED PROCESSED GOODS

(76) Inventor: Volker Probst, Berlin (DE)

( * ) Notice: Subject to any disclaimer, the term of this patent is extended or adjusted under 35 U.S.C. 154(b) by 0 days.

(21) Appl. No.: 13/000,355

(22) PCT Filed: Jun. 19, 2009

(86) PCT No.: PCT/EP2009/004459
§ 371 (c)(1),
(2), (4) Date: Apr. 6, 2011

(87) PCT Pub. No.: WO2009/153059
PCT Pub. Date: Dec. 23, 2009

(65) Prior Publication Data
US 2011/0183461 A1    Jul. 28, 2011

(30) Foreign Application Priority Data

Jun. 20, 2008    (EP) .................................... 08011247

(51) Int. Cl.
*H01L 21/67*    (2006.01)
*H01L 31/032*    (2006.01)
(Continued)

(52) U.S. Cl.
CPC ...... *H01L 21/67109* (2013.01); *C23C 14/5866* (2013.01); *C23C 16/4411* (2013.01);
(Continued)

(58) Field of Classification Search
CPC .................... H01L 21/67109; H01L 31/0322; H01L 21/67098; H01L 21/02568; C21C 16/4411
USPC ............ 438/95, 478; 118/719, 724, 725, 729; 427/58, 248.1; 257/E21.09, E31.008
See application file for complete search history.

(56) References Cited

U.S. PATENT DOCUMENTS 5,935,324 A    8/1999    Nakagawa et al.
6,949,202 B1 *   9/2005    Patel et al. ...................... 216/58
(Continued)

FOREIGN PATENT DOCUMENTS

CN    1912178 A    2/2007
CN    101095240 A    12/2007
(Continued)

OTHER PUBLICATIONS

European Search Report mailed Oct. 9, 2008, in corresponding European Application No. 08011247.7, filed Jun. 20, 2008, 2 pages.
(Continued)

*Primary Examiner* — Kevin Parendo
(74) *Attorney, Agent, or Firm* — Seed IP Law Group PLLC (57) ABSTRACT

A processing device for processing stacked processed goods for the production of conducting, semiconducting, or insulating thin layers includes, in at least one embodiment, an evacuatable process chamber configured to receive a process gas. A tempering device keeps at least a partial region of a wall of the evacuatable process chamber at a predetermined first temperature during at least part of the processing. The first temperature is between a second temperature that is room temperature and a third temperature, generated in the evacuatable process chamber, that is above room temperature. A heated gas flow cycle flows through a gas guiding device in the evacuatable process chamber. The stacked processed goods are insertable through a lockable loading opening into the gas guiding device, and a gas inlet device feeds the process gas into the gas flow cycle. A process system may further include a cooling device and/or a channeling device.

50 Claims, 4 Drawing Sheets

(51) Int. Cl.
*H01L 21/02* (2006.01)
*C23C 16/44* (2006.01)
*C23C 14/58* (2006.01)
*H01L 31/20* (2006.01)

(52) U.S. Cl.
CPC .... *H01L21/02568* (2013.01); *H01L 21/67005* (2013.01); *H01L 21/67017* (2013.01); *H01L 21/67098* (2013.01); *H01L 31/0322* (2013.01); *H01L 31/20* (2013.01); *Y02E 10/541* (2013.01)

(56) References Cited

U.S. PATENT DOCUMENTS

| | | | |
|---|---|---|---|
| 2001/0031541 A1* | 10/2001 | Madan et al. | 438/482 |
| 2002/0195439 A1* | 12/2002 | Moller | 219/400 |
| 2004/0099216 A1* | 5/2004 | Koh et al. | 118/723 CB |
| 2004/0149384 A1* | 8/2004 | Kanno et al. | 156/345.24 |
| 2006/0065297 A1* | 3/2006 | Terakawa | 136/255 |
| 2007/0116893 A1 | 5/2007 | Zwaap et al. | |
| 2007/0119373 A1* | 5/2007 | Kumar et al. | 118/723.001 |
| 2007/0187386 A1* | 8/2007 | Kim et al. | 219/385 |
| 2007/0289624 A1* | 12/2007 | Kuriyagawa et al. | 136/262 |
| 2008/0053614 A1* | 3/2008 | Sago et al. | 156/345.33 |
| 2008/0105204 A1* | 5/2008 | Nakada et al. | 118/728 |
| 2008/0105650 A1* | 5/2008 | Sugai et al. | 216/69 |
| 2008/0110495 A1 | 5/2008 | Onodera et al. | |
| 2008/0199612 A1* | 8/2008 | Keevers et al. | 427/255.11 |
| 2008/0210295 A1* | 9/2008 | Basol | 136/252 |
| 2011/0269089 A1* | 11/2011 | Echizenya et al. | 432/221 |

FOREIGN PATENT DOCUMENTS

| | | |
|---|---|---|
| DE | 197 17 565 A1 | 11/1997 |
| DE | 10 2004 024 601 A1 | 12/2005 |
| EP | 1 833 097 A1 | 12/2007 |
| EP | 1 643 199 B1 | 5/2010 |
| GB | 1 419 308 A | 12/1975 |
| JP | 62-131188 A | 6/1985 |
| JP | 05-157461 A | 6/1993 |
| JP | 10-197166 A | 7/1998 |
| JP | 2006-186114 A | 7/2006 |
| WO | 2006/128247 A1 | 12/2006 |
| WO | 2007/053016 A2 | 5/2007 |

OTHER PUBLICATIONS

International Search Report mailed Aug. 24, 2009, in corresponding International Application No. PCT/EP2009/004459, filed Jun. 19, 2009, 2 pages.

Australian Office Action dated Jun. 25, 2013, in Australian Patent Application No. 2009259641, filed Dec. 23, 2009, 6 pages.

Kosaraju, S., et al., "Formation of Chalcogen Containing Plasmas and Their Use in the Synthesis of Photovoltaic Absorbers," Journal of Vacuum Science and Technology A: Vacuum, Surfaces, and Films 23(4):1202-1207, Jul./Aug. 2005.

Lakshmikumar, S.T., and A.C. Rastogi, "Selenization of Cu in Thin Films for the Preparation of Selenide Photo-Absorber Layers in Solar Cells Using Se Vapour Source," Solar Energy Materials and Solar Cells 32(1):7-19, Jan. 1994.

Sebastian, P.J., et al., "$CuInS_2$ Based Solar Cell Structures by CVTG," Applied Energy 52(2-3):199-207, 1995.

Yan, Y.-H., et al., "Characterization of $CuInS_2$ Thin Films Prepared by Sulfurization of Cu—In Precursor," Transactions of Nonferrous Metals Society of China 18(5):1083-1088, Oct. 2008.

\* cited by examiner

PROCESS DEVICE FOR PROCESSING IN PARTICULAR STACKED PROCESSED GOODS

The invention relates to a process device for the processing of in particular stacked processed goods, particularly at medium to high temperatures, comprising an evacuatable process chamber for receiving a process gas, a gas conveying device for creating a circulating gas flow in the process chamber and a heating device for heating the gas which flows through the process chamber.

A known process device of this type may be a diffusion oven with a process chamber defined by a quartz tube which is for instance used for the manufacture of thin-film solar cells of the CIS type. The known diffusion oven is used in particular for producing, with the help of seleniferous and/or sulphurous process gasses such as for instance H2Se or H2S gas, a chalcopyrite semiconductor layer which may for instance form the absorber layer of a solar cell on the process goods, for instance glass substrates which are pre-coated with metallic precursors, such as for instance copper, indium and/or gallium.

For this purpose, a substrate stack which is to be processed and is provided with a precursor coating is introduced into the quartz tube. After the sealing of the quartz tube, the same is evacuated and filled with inert gas as many times as required for achieving a desired purity in respect of residual oxygen and residual moisture. Thereafter the process gas H2Se is admitted with an inert carrier gas in a desired concentration and up to a desired pressure. Furthermore, the heating device, a jacket heating arranged around the quartz tube, is switched on and controlled in such a manner that a desired temperature profile is generated on the substrates.

After a pre-determined reaction time at a temperature between 350° C. and 450° C. the quartz tube is evacuated. Thereafter a mixture of H2S and inert carrier gas is admitted and the temperature is increased to about 450° C. to 550° C. After a pre-determined reaction time, the assembly is then cooled down to room temperature and the toxic process gasses are eliminated by means of different pump-rinse cycles. After a ventilation of the quartz tube, the substrates with the thin layers reacted to chalcopyrite semiconductors can be removed.

The semiconductor layer which has been generated in this manner may be a Cu(In, Ga)(Se, S)2 layer with a typical Ga concentration rise towards a back electrode and a S concentration rise towards the surface. The semiconductor layer is virtually a multiphase layer with a graduated phase transition and a graduated band gap.

A problem which is inherent in the known process device is the unfavourable cylindrically symmetric infrared radiation geometry and the shading of the infrared radiation in the substrate stack. The thermal inhomogeneities which are generated in this manner may only be reduced when the heating and the cooling-down rates are kept low. This significantly increases the minimum possible process time, thus distinctly limiting the process capacity. There also remains a not insignificant scattering of the process result over the substrate stack.

The evacuatable process chamber is formed by a quartz tube because common vacuum chamber materials are made of metal alloys, and because metals as well as their alloys are not stable in selenium vapour and sulphur vapour as well as in H2Se and H2S gas, but do corrode. The corrosion products settle as tiny particles and fine dust on the chalcopyrite semiconductor and damage the same through electric short circuits and as deep imperfections. Moreover, a process chamber that is formed by a quartz tube can, for product engineering reasons, be manufactured with a diameter exceeding 80 cm only with a considerable financial extra expense. Consequently, the size of the substrates that are to be processed in such a device is limited.

From GB 1 419 308 A an evacuatable oven for heat treatment is known where the heating elements are arranged within the oven area. With this oven, a cooling-down as well as a heating-up in the vacuum or in a protective atmosphere is to be accomplished. The oven according to GB 1 419 308 A may furthermore be equipped with a heating element. This device is equipped and designed for the heat treatment of steel and other metals and metal alloys, respectively.

WO 2007/053016 A2 discloses an oven for the production of photovoltaic solar cells by means of a diffusion process. In the process chamber of said oven, planar substrates for the production of solar modules can be arranged. It is reported that the use of a cooling device which cools the process gas fed into the process chamber can considerably reduce the cycle times during processing of the substrates. The cooling device is described as a coolant circuit which is coupled to a heat exchanger. Re-heated process gas is removed from the process chamber, it is cooled down outside the process chamber and subsequently re-introduced into the process chamber. The disadvantage of this device is that extremely reactive, toxic process gas is to be removed from the process chamber. Consequently, the device expenditure is inevitably very high in order to meet the required safety standards.

From EP 1 643 199 A1 an evacuatable oven is known into which a cooling unit for the cooling of a warmed-up product is integrated. Here, a gas is uniformly circulated under pressure in the oven. The oven according to EP 1 643 199 A1 is designed for the thermal treatment of metals.

It is the object of the invention to provide a process device of the kind mentioned in the opening paragraph which not only distinguishes itself by an improved economic efficiency but also facilitates the formation of more homogeneous layers, for instance in respect of conducting or semiconducting thin layers, in particular chalcopyrite semiconductors, or insulating thin layers, which facilitates an easier maintenance, which permits an up-scaling of process capacity as well as of substrate format and is very durable also under continuous operation.

For achieving the object, a process device is provided for the processing of in particular stacked process goods, particularly in the form of planar substrates for the production of thin layers, particularly of conducting, semiconducting or insulating thin layers, comprising an evacuatable process chamber for receiving a process gas, comprising at least one tempering device, particularly at least in sections in and/or in thermal operative connection with at least one wall, particularly all walls of the process chamber, said chamber being equipped and suited to keep at least a partial region of the wall, particularly substantially the entire process chamber wall, of the process chamber at a pre-determined temperature, particularly to keep the same at a first temperature during at least part of the processing of the stacked processed goods, said temperature not being below room temperature as the second temperature, and being below a third temperature which can be generated in the process chamber and is above room temperature; at least one gas conveying device for creating a circulating gas flow in the process chamber, particularly a forced convection, at least one heating device for heating the gas said heating device being disposed or able to be disposed in the circulating gas flow created by the gas conveying device, at least one gas guiding device configured for receiving the processed goods stack and which is disposed or can be disposed in the process chamber such that at least part of the circulating gas flow that is created or can be created extends through the gas guiding device; optionally at least one loading opening that can be locked with a first gas- and/or vacuum-tight locking device through which the processed goods stack can be inserted into the gas guiding device; and optionally at least one gas inlet device for feeding the process gas into the circulating gas flow.

In one embodiment it may be provided that at least one wall of the process chamber, in particular all walls, comprise metals or metal alloys, in particular high-grade steel, preferably high-grade alloy steel or substantially consist thereof or that the process chamber comprises a quartz glass tube or a ceramic tube. Suitable metals and metal alloys comprise also for instance aluminium and/or aluminium alloys.

Thin layers within the meaning of the invention are to comprise for instance such systems which may be achieved on a substrate, for instance by means of physical vaporisation (PVD), thermal vaporisation, chemical vapour deposition (CVD), sputtering, galvanic deposition or deposition according to the sol-gel process. Therefore, thin layers within the meaning of the invention may have for instance average thicknesses of approximately up to 100 µm, preferably of up to about 10 µm.

The evacuatable process chamber of the process device according to the invention comprises at least one tempering device in order to keep at least a partial region of a wall of the process chamber at a pre-determined temperature. Here, the tempering device is provided preferably in and/or in thermal operative connection with at least one wall of the process chamber and is preferably equipped and suited to keep at least a partial region of the wall, in particular substantially the entire process chamber wall of the process chamber at a first temperature during at least part of the processing of the stacked process goods which is not below room temperature as the second temperature and which is furthermore below a third temperature that is above room temperature that is created during processing. During processing the tempering device keeps the process chamber wall preferably at a temperature and/or within a temperature range at which and/or within which the process gasses in the process chamber do not condense under the temperature and pressure and/or partial pressure conditions that prevail in the chamber. Furthermore, pursuant to another preferred embodiment, steps are taken for ensuring that the temperature and/or the temperature range of the process chamber wall does not exceed during the processing (first temperature) a value which damages the process chamber material, in particular as wall material. Damage that is generated by such overheating may for instance cause distortions and impair the vacuum tightness of the process chamber. This applies in particular to process chamber walls which are made of a metallic material, for instance high-grade steel. During processing the temperature of the process chamber wall (first temperature) is preferably kept at a temperature and/or within a temperature range which lies within the range of room temperature and for instance of about 150° C. to 250° C., in particular up to 200° C. Room temperature within the meaning of the invention is to comprise for instance a temperature of 20° C. Depending on the relevant application, processing temperatures (third temperature) may vary widely and may, for instance, for the processing of semiconducting thin layers reach, inter alia, up to about 600° C. or more.

The temperature device may comprise for instance channels which run through the process chamber wall, for instance meandering, or pipes which are arranged on an external surface of the process chamber, for instance welded thereon, in particular meandering, through which a tempering fluid, for instance a thermal or hot oil, flows. Said pipes are in thermal operative connection with the process chamber wall. The channels in the process chamber wall can be created for instance through drilling and may have in one embodiment a thickness and/or a diameter ranging from 1 to 4 cm. In another embodiment, the tempering device further comprises at least one heat exchanger and at least one thermal oil and/or hot oil reservoir.

By means of the tempering device, the process chamber wall can be kept at a temperature at which the material of the process chamber wall does not corrode even under the influence of the process gas atmosphere. It is known for instance that a corrosion attack distinctly increases with the temperature and that at temperatures ranging below 250° C. high-grade steel does hardly noticeably corrode within a seleniferous or sulphurous process gas atmosphere. Owing to the known vapour pressure curves for selenium and sulphur, it cannot be expected that selenium and/or sulphur will condense under the process conditions at the tempered walls of the process chamber. By means of these measures it is ensured that the process chamber wall can be classified as being of the type of a flow wall reactor that has a long-term stability and does, therefore, not release any process-damaging particles. Furthermore, the tempering ensures a very good controllability of the process because in general in the course of the process, vaporous or gaseous constituents of the process gas and in particular selenium or sulphur, for instance as dissociation products of H2Se or H2S, are neither uncontrollably condensed out of the process nor uncontrollably re-introduced into the process.

Finally, the tempering of the process chamber wall makes it possible to form the process chamber not from a quartz tube but from a metallic material, such as for instance high-grade steel which provides a considerable leeway in respect of the configuration and in particular in respect of the dimensioning of the process chamber. The process devices of the present invention do of course also comprise process chambers which contain a quartz tube. This applies in particular also to such quartz tube process chambers which are equipped with metal flanges, for instance high-grade steel flanges.

High-grade steels within the meaning of the present invention comprise alloyed and unalloyed steels. From amongst the unalloyed steels, in particular those containing less than 0.025 weight percent of sulphur and phosphorus are preferred. Alloyed high-grade steels, in particular chromium steel and/or chromium-nickel steel are preferred. Chromium steel and/or chromium-nickel steel within the meaning of the present invention is a high-grade steel with a chromium content of more than about 9 weight percent that does not corrode easily and/or is corrosion-resistant.

In addition, a processing chamber formed from a metal material can be produced not only with the same processing capacity, but particularly also with a much larger chamber volume and with a lower economic outlay than silica tubing. Whereas silica tubing diffusion ovens can be produced only with a diameter of up to 80 cm, a processing chamber formed from a metal material can be adapted comparatively easily to larger sizes of processed goods, i.e. substrate surfaces, on account of the corresponding increase in height and the greater width. For example, planar substrates are accessible with a longitudinal and/or transverse extension of 1 m or more, for example with an extension of 1 to 3 m. Furthermore, considerable degrees of freedom with regard to the design of this processing chamber result from the fact that the processing devices according to the invention no longer have to rely on processing chambers made of silica glass. For example, the processing chamber can essentially be square, rectangular, trapezoid or triangular in cross-section, at least in sections.

The processing device according to the invention further includes a gas conveying device for the generation of a circulating gas flow in the processing chamber and a heating device arranged in the circulating gas flow generated by the gas conveying device for the heating of the gas flowing through the processing chamber. In other words, the heating device is arranged within the processing chamber, so that it is possible to dispense with a heat source which lies outside the processing chamber, e.g. a source of infrared radiation, for the heating of the process gas. Thus, the processing chamber does not need to be improved with regard to infrared radiation, which considerably simplifies the design of the processing chamber and, moreover, also makes it possible to use a metal material for the production of the processing chamber.

In addition to the gas conveying device, the processing device according to the invention further has a gas guiding device which receives the stacked processed goods and which is arranged in the processing chamber in such a way that at least a part of the circulating gas flow generated by the gas guiding device flows through it. On the one hand, the gas conveying device and the gas guiding device ensure the particularly homogeneous heating and cooling of the stacked processed goods by forced convection and, on the other hand, ensure particularly homogeneous gas distribution and hence ultimately particularly homogeneous layer formation, e.g. of a chalcopyrite semiconductor, on the processed goods, e.g. glass substrates.

Moreover, the combination of a gas conveying device, a gas guiding device and a heating device as well as particularly also a tempering device make it possible to have a faster heating and heating rate, as a result of which shorter processing times and thus a higher throughput of processed goods is possible.

On account of the fact that the processing device is designed for the processing of stacks of processed goods, i.e. for so-called batch operation, the processing device has a higher level of compactness, simpler maintenance and accessibility, and a lower level of complexity compared with pure inline systems.

Advantageous developments of the invention can be found in the subsidiary claims, the description and the drawing.

According to a first form of the design, a thermal insulation material is provided on the inside of the processing chamber wall at least in sections, the said thermal insulation material preferably being unreactive under the processing conditions. On the one hand, the insulation material forms an additional protection for the processing chamber wall, e.g. against corrosion, and, on the other, provides for a certain thermal decoupling of the processing chamber wall from the gaseous atmosphere found in the processing chamber, so that the temperature of the gaseous atmosphere can be controlled more accurately. The thermal decoupling is essentially based on the low specific heat capacity and low thermal conductivity, as is typical of insulation materials. Moreover, the thermal insulation material prevents the processing chamber wall from being heated above the specified temperature by hot process gas and the discharge of heat from becoming too great. The thermal insulation material is particularly advantageous in the case of forced convection by the gas conveying device, as the discharge of heat is thus clearly kept in check on account of the otherwise good passage of heat. The insulation material can, but does not have to cover the whole of the inside of the processing chamber wall. The processing device according to this invention distinguishes itself in a form of the design by the fact that the metal surfaces of the processing chamber wall, for example made of stainless steel, can also be completely free on the inside, i.e. not be covered with insulation material.

The insulation material can, for example, be a ceramic, a vitroceramic, a graphite, including a fibrous material such as a carbon fibre reinforced carbon (CFC)), or a ceramic fibre-containing insulation material, e.g. consisting of $SiO_2$ and $Al_2O_3$ fibres.

According to another form of the design, the gas guiding device has at least one upper dividing plate which defines a first area of the chamber in the processing chamber above the gas guiding device which receives the stacked processed goods and a lower dividing plate on the opposite side which defines a second area of the processing chamber below the gas guiding device which receives the stacked processed goods. In addition, the gas guiding device can also have two dividing plates at the side.

It is preferable if the gas guiding device has at least one distribution device for particularly uniform planar distribution of the gas flow, with the stacked process goods preferably being arranged downstream of the distribution device. The distribution device can, for example, be a plate which is provided with slits and/or holes. The distribution device and the gas guiding device preferably include or consist of an unreactive material, e.g. a vitroceramic, a silicon carbide or a silicon nitride.

Depending on the kind of process gases used, other materials such as metals or metal alloys or steels can also be used here instead of the suggested unreactive materials, provided that they are resistant to the process gases.

In a similar way to the processing chamber wall, the surfaces of the gas guiding device can also be provided with a thermal insulation material which is preferably unreactive under the processing conditions. In this way, the gas guiding device is at least to a large extent thermally decoupled from the gaseous atmosphere in the processing chamber, so that the processing device has a lower total thermal mass, particularly in the dynamic case of a required temperature change, with the result that the temperature of the process gas in the processing chamber can also still be more quickly and accurately controlled. On account of its unreactivity to reactive components of the process gas, the insulation material also forms an additional protection for the gas guiding device, e.g. against corrosion.

According to another form of the design, the gas conveying device includes at least one ventilator which is preferably made of an unreactive material. The ventilator can be conceived of in different forms of design and is not confined to the principle shown in the diagrams. What is important is that the ventilator is as efficient as possible for the conveyance of the process gases. The ventilator can be attached to a drive shaft which extends into the processing chamber and which is preferably also made of an unreactive material. By using the unreactive material, the ventilator and/or the drive shaft are also protected against attack by the reactive components of the process gas and particularly against corrosion. For example, axial ventilators and radial ventilators are mentioned as suitable forms of ventilator design.

It is advantageous if the ventilator is arranged in the region of one of the front ends of the stacked processed goods. This arrangement of the ventilator contributes to the particularly homogeneous throughput of the stacked processed goods with the process gas and thus particularly homogeneous film separation and film reaction. In a form of the design, the front ends in the sense of this invention include the particularly opposite lying end sections of the processing chamber which do not have any loading or unloading apertures.

In order to increase the rate of flow and the homogeneity of the gas flow still further, it is advantageous to arrange another ventilator in the region of the other front end of the stacked processed goods. With this arrangement of two ventilators, one ventilator is developed in such a way that it conveys the process gas into the stacked processed goods, while the other ventilator conveys the process gas out of the stacked processed goods. In other words, one ventilator operates in a so-called pushing operation, while the other operates in a sucking operation.

The unreactive material of the ventilator or the drive shaft can, for example, be a ceramic material such as silicon nitride or silicon carbide. The ventilator and/or the drive shaft can be coated with such a material.

It is preferable if the drive of the ventilator or the drives of the ventilators can also be operated in a reverse direction of rotation, so that the circulating gas flow can be reversed.

According to another form of the design, the heating device includes at least one corrosion-resistant heating element. In particular, the heating device can be designed as a stacked plate of resistant heating elements. For example, graphite or silicon carbide heating elements can be used as stacked-plate meander heaters or as heating rods. Depending on the configuration of the gas flow rate, the heater output and the surface of the heater matrix, heating rates for processed goods of a few degrees Celsius per minute up to a few degrees Celsius per second can be reached.

According to another form of the design, a cooling device is provided in the cooling chamber and is preferably arranged or can be arranged in the circulating gas flow, the said cooling device preferably including at least one cooling element and particularly one stacked-plate cooler or one multiple-tube cooler. The cooling element can, for example, be kept at a temperature of e.g. about 200° C. or below by means of an oil tempering device. Depending on the gas flow rate, the cooler output and the surface of the cooler arrangement, cooling rates of up to a few degrees Celsius per minute can be reached on the processed goods.

According to another form of the design, gas diverting elements are provided, by means of which the circulating gas flow can be diverted in such a way that either the heating device or the cooling device is arranged in the circulating gas flow. At the appropriate setting, the gas diverting elements ensure the particularly quick heating or cooling of the processed goods at the required temperature.

As has already been mentioned, the processed goods can include planar substrates, particularly glass substrates, for the production of semiconductor thin layers, mainly chalcopyrite semiconductor layers, preferably I-III-VI connecting semiconductor layers and particularly $Cu(In,Ga)(Se,S)_2$ semiconductor layers, for example for solar cells. Common are chalcopyrite semiconductors made of Group I, III and VI elements, either built on or consisting of these, with e.g. Cu being able to be chosen as the Group I element, e.g. In and/or Ga being able to be chosen as the Group III element and e.g. Se and/or S being able to be chosen as the Group VI element. Depending on the choice of components used, it is also possible to talk about CIS or CIGS systems. While e.g. Cu(In)(Se) or Cu(In) (Se,S) systems fall under CIS systems, such systems which are based on e.g. Cu(In, Ga)(Se) and Cu(In, Ga)(Se,S) are subsumed under CIGS systems.

A device of the above kind is thus suitable for, for example, the production of semiconductor thin layers, e.g. chalcopyrite absorber layers, particularly for solar cells.

According to another form of the design, the processing device according to the invention is characterized by at least one lockable unloading aperture, particularly with a second gas and/or vacuum tight locking device, by means of which the stacked processed goods can be removed from the gas guiding device. It is preferable if the locking devices are attached in the region of the opposite lying sections of the processing chamber.

Another object of the invention is also a processing system for the processing of stacked processed goods with at least one processing device according to the invention, with the processing device having a loading aperture through which the stacked processed goods are able to be brought into the gas guiding device and having an unloading aperture through which the stacked processed goods can be removed from the gas guiding device.

The task on which the invention is based is further solved by means of a processing system for the processing of stacked processed goods, including a) at least one processing device according to the invention with a first lockable loading aperture, particularly with a first gas and/or vacuum tight locking device and through which stacked processed goods are able to be brought into the gas guiding device, and a first lockable unloading aperture, particularly with a second gas and/or vacuum tight locking device and through which stacked processed goods can be removed from the gas guiding device, b) at least one cooling device, including at least one cooling chamber with a second lockable loading aperture, particularly with a third gas and/or vacuum tight locking device, and a second lockable unloading aperture, particularly with a fourth gas and/or vacuum tight locking device, with the first unloading aperture and the second loading aperture being arranged adjacent to each other and aligned with each other or being able to be arranged and aligned adjacent to each other in order to transfer processed goods from the processing device into the cooling device, and/or c) at least one channelling device, including at least one channelling chamber with a third lockable loading aperture, particularly with a fifth gas and/or vacuum tight locking device, and a third lockable unloading aperture, particularly with a sixth gas and/or vacuum tight locking device, with the third unloading aperture and the first loading aperture being arranged adjacent to each other or aligned with each other or being able to be arranged adjacent to each other or aligned with each other in order to transfer processed goods from the channelling chamber to the processing device.

In one form of the design, this processing system can be further characterized by at least a first connecting section with which particularly the first unloading aperture is linked or is able to be linked to the processing device and particularly the second loading aperture is linked or is able to be linked to the cooling device and/or at least a second connecting section with which particularly the first loading aperture is linked or is able to be linked to the processing device and particularly the third unloading aperture is linked or is able to be linked to the channelling chamber.

In so doing, provision can also be made for the cooling device in the cooling chamber to have at least one cooling device which is preferably able to be tempered in a range from −196° C., particularly −50° C., preferably 10° C., for example room temperature, to 250° C. and particularly at least one cooling element and/or one stacked-plate cooler and/or one multiple-tube cooler.

Cooling can e.g. be undertaken with the use of cooling water which usually has a temperature of 14° C. to 20° C.

In another form of the design, provision is made for the channelling chamber to have at least one heating device.

According to the invention, provision is further made for at least two processing devices according to the invention to be connected or to be able to be connected to each other via their respective unloading and loading apertures either directly or by means of a third connecting section.

Developments of the processing system according to the invention further provide for at least one wall, particularly all walls, of the cooling chamber, particularly including the locking devices, and/or the channelling chamber, particularly including the locking devices, and/or the first, second and/or third connecting sections to contain or essentially to consist of metals or metal alloys, e.g. aluminium or aluminium alloys, particularly stainless steel, preferably alloyed stainless steel.

Locking devices in the sense of the invention can e.g. be or include doors and plate valves.

Such forms of design are also included, characterized by at least one tempering device at least in sections in and/or in thermal operative connection with at least one wall, particularly all walls, the channelling chamber, the cooling chamber and/or the first, second and/or third connecting section.

It is advantageous if the processing system includes another processing device which is arranged adjacent to the processing device and which has a loading aperture which is aligned with the unloading aperture of the processing device. The loading aperture and/or unloading aperture can or can in so doing be able to be locked by a door, particularly a plate valve.

If is preferable if the other processing device has a cooling device which has a cooling device which is arranged in a circulating gas flow which is produced by a gas conveying device in an evacuatable processing chamber of the cooling device. Moreover, the processing system can also include a channelling chamber situated in front of the first processing device when viewed in terms of the throughput direction.

As a result of the adjacent arrangement of several processing devices, the processing system forms a throughput system for the stacked processed goods which are to be processed. To a certain extent, it is therefore a "batch inline system" which combines the advantages of continuous throughput operation with those of batch operation.

It is evident that the number of processing devices is not limited to two. Rather, the processing system can, for example, include a number n of processing devices and number m of cooling devices, with n and m being natural numbers and with n=m=1 only applying to the simplest version of a batch inline combined processing system.

Another object of the invention is, moreover, a process for the processing of stacked processed goods, particularly at medium to high temperatures, with the characteristics of claim 25 or 26, by means of which the above-mentioned advantages can be reached accordingly.

By a medium temperature in the sense of this invention should e.g. be understood temperatures in a range from 100° C. to 600° C. By a high temperature in the sense of this invention in connection with the process according to the invention should e.g. be understood temperatures in a range from 600° C. to 1000° C.

According to this, there is distinguished a process according to the invention for the processing of particularly stacked and/or planar processed goods, particularly for the production of thin layers, particularly conducting, semiconducting and insulating thin layers, by the use of a processing device according to the invention or a processing system according to the invention in which the stacked processed goods are received during a processing phase in the gas guiding device which is arranged in the processing chamber which receives a gas, with at least a part of the wall of the processing chamber, particularly during at least a part of the processing of the stacked processed goods, being particularly at a first temperature by means of the tempering device, the said first temperature not lying below room temperature as the second temperature and lying below a third temperature which lies above room temperature and which is generated in the processing chamber during processing at least in stages, with a circulating gas flow being produced in the processing chamber in such a way that at least a part of the circulating gas flow generated passes through the gas guiding device and the gas is heated by means of a heating device arranged in the circulating gas flow.

According to one form of the design, provision is made for a process gas which preferably contains sulphur or selenium and particularly includes $H_2S$ and/or $H_2Se$ gas or gaseous sulphur and/or gaseous selenium to be guided into the processing chamber by a gas inlet device during the processing phase.

In one form of the design, the processed goods are planar, particularly precoated glass substrates for the production of semiconductor thin layers, mainly chalcopyrite semiconductor layers, preferably I-III-VI connecting semiconductor layers and particularly $Cu(In,Ga)(Se,S)_2$ semiconductor layers, for example for solar cells.

Particularly preferred is a development of the process according to the invention in which the first temperature is kept within a range from room temperature to about 250° C., particularly up to 200° C., by the tempering device during processing.

This invention is based on the surprising finding that processing devices as well as processing systems with which particularly stacked processing goods, particularly in the form of planar substrates for the production of thin layers, e.g. conducting, semiconducting and insulating thin layers, can be produced without any problem are maintained, regardless of the choice of material for the processing chamber. With the devices according to the invention, overheating as well as an accompanying delay, which can result in a lack of density, can be avoided by the processing chambers. Of further benefit is the fact that the condensation of the process gas on the walls of the processing chamber can be avoided. As a result, very homogeneous gas concentrations can be set over the whole of the processing chamber and can also be maintained during processing, with a particularly homogeneous structure layer structure being able to be guaranteed in the case of the semiconductor thin layer systems produced. By preventing or greatly reducing condensation, no reevaporation of the condensed material which could undermine the uniform gas concentration within the processing chamber takes place in a subsequent processing cycle. Of benefit is also the fact that thermal insulation materials can be used in the processing chamber in a way which increases efficiency, particularly by means of application to the internal wall. As particularly beneficial has been found to be the fact that the processing chambers in the devices according to the invention are no longer subject to geometric restrictions or restrictions with regard to size. For example, processing chambers made of stainless steel are accessible with any geometry as well as in sizes which are considerably greater than the diameter of the original silica glass ovens. Regardless of the choice of material for the processing chamber, the amount of heat lost can be significantly reduced during processing with the devices according to the invention. When using the devices according to the invention, it is also particularly the case with silica glass processing chambers that it is no longer critical whether metal flanges, for example stainless steel flanges, are used or whether use is made e.g. for these flanges of seals which are only heat stable up to e.g. 200° C. or 250° C. Particularly when using the processing system according to the invention, it is possible to reduce the cycling times considerably. The thorough cooling of the planar substrates, for example the semiconductor thin layers, can be undertaken in the cooling device while the next stage of processing is already running and, where relevant, the next processing stage is being prepared in the channelling chamber.

Figure 1:
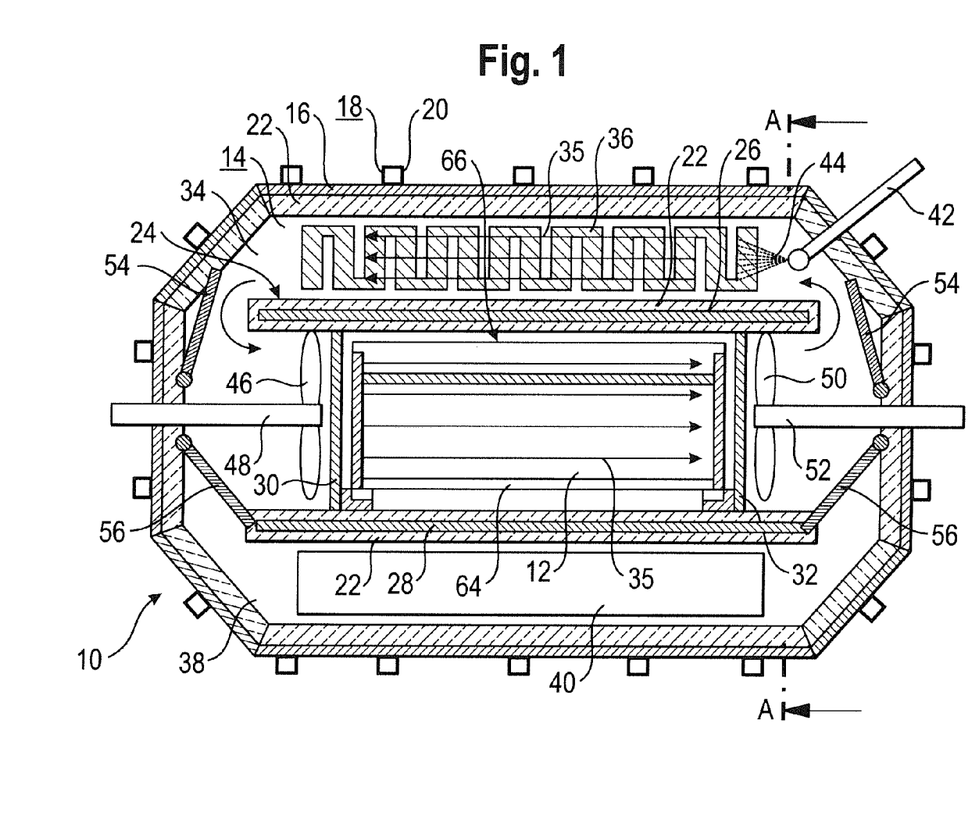
FIG. 1 is a schematic cross-sectional view of a processing device according to the invention.

In the following, the invention is described purely by way of example on the basis of advantageous embodiments and with reference to the enclosed drawings, in which:

FIG. 1 shows a processing device 10 according to the invention, which is designed for forming Cu(In, Ga)(Se, S)2 semiconducting thin layers on glass substrates 12 intended for the production of solar cells.

The processing device 10 comprises an evacuatable processing chamber 14 which is bounded by a processing chamber wall 16. The processing chamber wall 16 is made of high-grade steel and is held within a temperature range from 150° C. to 250° C. by means of a tempering device 18.

In the present embodiment, the tempering device 18 is formed by pipes 20 meandrously arranged around the processing chamber 14 and attached to the outside of the processing chamber 14, particularly welded to the processing chamber wall 16, through which a suitable hot oil is run. Alternatively or additionally, the hot oil may also run through channels (not shown) suitably inserted into the processing chamber wall 16. Additionally, the outside of the processing chamber wall 16 may be provided with a thermal insulating material.

At an inside of the processing chamber wall 16, the processing chamber is lined at least approximately completely with a non-corrodible thermal insulating material 22 which contains few particles and is heat-resistant up to a temperature of at least 1000° C. The thermal insulating material 22 can be made of ceramic, glass-ceramic, graphite, including a fibrous material, such as Carbon Fiber Reinforced Carbon (CFC), or an insulating substance containing ceramic fiber, e.g. $SiO_2$ and $Al_2O_3$ fibers.

A gas guiding device 24 is arranged in a central area of the processing chamber 14.

The gas guiding device 24 comprises an upper separating plate 26 and a lower separating plate 28. In addition to the upper and lower separating plates 26 and 28, respectively, a front and a back separating plate (not shown) may be provided. However, the front separating plate and the back separating plate are normally omitted, since their function is realized by the thermally insulated chamber side walls including gates or vacuum valves arranged there.

The upper and lower separating plates 26 and 28, respectively, as well as the front and the back separating plates, if necessary, are preferably formed of a non-corrodible material, for example a ceramic material, such as silicon carbide or silicon nitride, or a glass-ceramic material. In addition, all separating plates are covered with a layer of the thermal insulating material 22 already mentioned.

Figure 2:
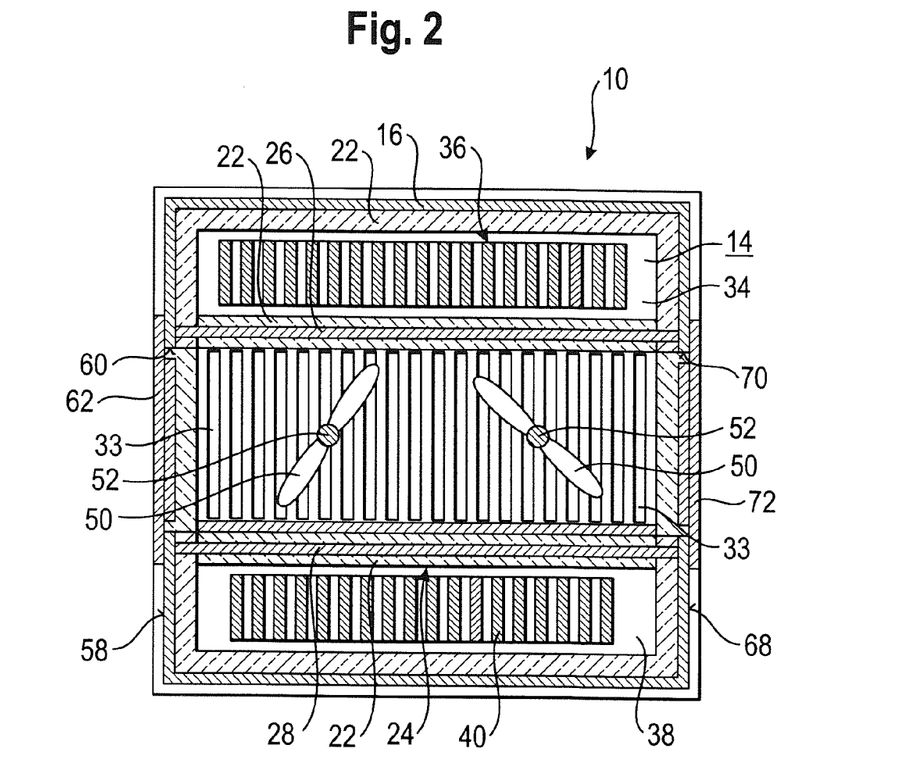
FIG. 2 is a schematic longitudinal section view of the processing device along line A-A of FIG. 1.

Furthermore, the gas guiding device 24 comprises a first distributing device 30 arranged in the area of a first (in FIG. 1 left-side) end wall of the gas guiding device 24 between the separating plates 26, 28, and a second distributing device 32 arranged in the area of a second (in FIG. 1 right-side) end wall of the gas guiding device 24 between the separating plates 26, 28. The distributing devices 30, 32 are each formed of a non-corrodible material, such as silicon carbide, silicon nitride, or a glass-ceramic material. As shown in FIG. 2, each of the distributing devices 30, 32 in the present embodiment is a plate provided with a plurality of vertical slits 33, particularly aligned with the glass substrates 12. Alternatively or additionally, a plurality of holes can be formed in the plate or in each plate.

The upper and lower separating plates 26 and 28, respectively, the first and the second distributing devices 30 and 32, respectively and, if necessary, also the front and the back separating plates not shown form a casing for the substrates 12 which is executed at least approximately gap-tight, so that a gas current 35 running through the gas guiding device 24 is guided into the casing and cannot escape from it on the side.

In an upper chamber area 34 located between the upper separating plate 26 and the processing chamber wall 16, a heating device 36 is arranged, for example a silicon carbide meandering boiler matrix, while a cooling device 40, for example a plate stack cooler, is arranged in a lower chamber area 38 between the lower separating plate 28 and the processing chamber wall 16. Alternatively, it is possible to arrange the cooling device 40 in the upper chamber area 34 and the heating device 36 in the lower chamber area 38.

In the area of an end (in FIG. 1 of the right-side end) of the heating device 36, a gas inlet device 42 is arranged, which extends through the process chamber wall 16 and makes it possible to supply a process gas 44, in the present embodiment a seleniferous or sulphurous gas, such as $H_2S$ or $H_2Se$, to the processing chamber 14 from outside. Although the gas inlet device 42 can basically be arranged at any place in the processing chamber 14, the arrangement shown in FIG. 1 is particularly advisable, since in normal operation the process gas 44 supplied by the gas inlet device 42 runs through the heating device 36 first and is therefore heated immediately upon entering the processing chamber 14.

In the area of the first end wall of the gas guiding device 24, at least one first fan 46 driven by a first drive shaft 48 which is extending through the processing chamber wall 16 is arranged upstream of the first distributing device 30. Two second ventilators 50 driven by second drive shafts 52 which are extending through the processing chamber wall 16 are arranged in the area of the second distributing device 32 on the opposite side of the gas guiding device 24.

Both the first and the second fan 46 and 50, respectively, as well as the first and the second drive shaft 48 and 52, respectively, are made of a corrosion-resistant material, such as a ceramic material, particularly silicon nitride or silicon carbide. The first fans 46 are driven so that they convey gas to the gas guiding device 24 while, at the same time, the second fans 50 are operated so that they remove gas from the gas guiding device 24. The operation of the fans 46, 50 thus creates a circulating gas flow directed counter clock-wise, as shown in FIG. 1. This means that the process gas 44 introduced into the processing chamber 14 by the gas inlet device 42 flows from the right to the left through the heating device 36, then downward and from the left to the right through the gas guiding device 24 and subsequently upward and again from the right to the left through the heating device 36.

For additional control of the gas flow in the processing chamber 14, an upper pair of switchable gas deflecting elements 54 and a lower pair of switchable gas deflecting elements 56 are provided. The upper gas deflecting elements 54 are arranged so that they can either permit the flow of the process gas 44 from the gas guiding device 24 to the upper chamber area 34 and from the upper chamber area 34 to the gas guiding device 24, or reduce it or prevent it completely. Accordingly, the lower gas deflecting elements 56 are arranged so that they can either permit a flow of the process gas 44 from the gas guiding device 24 to the lower chamber area 38 or from the lower chamber area 38 to the gas guiding device 24, or reduce it or prevent it completely.

In the situation shown in FIG. 1, the upper gas deflecting elements 54 are in an open position to enable circulation of the process gas through the upper area of the processing chamber 14, i.e. through the gas guiding device 24 and the heating device 36. The lower gas deflecting elements 56, however, are in a closed position, which means that they prevent circulation of the process gas 44 through the lower area of the processing chamber 14 and particularly through the cooling device 40. Consequently, in the situation illustrated in FIG. 1 only hot process gas is circulating, which contributes to holding a desired process temperature, for example in the range of 400° C. to 600° C. If, on the contrary, the upper gas deflecting elements 54 are closed and the lower gas deflecting elements 56 are open, the process gas 44 streams through the cooling device 40 and the glass substrates 12 are cooled down to a reduced temperature, e.g. 250° C.

In order to load the processing chamber 14, the processing device 10 comprises a front-side loading opening 60 made in the processing chamber wall 16 and which can be locked by means of a plate valve 62 or any other suitable gate.

The glass substrates 12 to be processed are arranged on a carrier 64, e.g. a roller-mounted trolley, vertically at intervals to form a processed goods stack 66, also called batch. The processed goods stack 66 is moved into the processing chamber 14 through the loading opening 60 and positioned in the gas guiding device 24. As soon as the loading opening 60 is locked, the processing chamber 14 is repeatedly evacuated and purged so as to reduce the content of oxygen and water in the processing chamber 14 as far as possible.

For the purpose of evacuation of the processing chamber 14, the processing chamber wall 16 has a suitable suction opening (not shown), which is connected to a pump system (not shown either). For purging the processing chamber 14, a suitable gas inlet is provided in the processing chamber wall 16 through which a purging gas, such as $N_2$, can be let into the processing chamber 14.

As soon as the atmosphere in the processing chamber 14 shows a suitable defined initial condition, the fans 46, 50 are switched on, the heating device 36 is activated and nitrogen gas is let in into the processing chamber 14. The upper gas deflecting elements 54 are opened at that time and the lower gas deflecting elements 56 are closed as shown in FIG. 1 so as to enable warming up of the glass substrates 12.

As soon as the temperature has reached the temperature required for the reaction to start in the processing chamber 14, a seleniferous, e.g. $H_2Se$-containing, process gas 44 is fed into the processing chamber 14 through the gas inlet device 42. The temperature required for starting the reaction can be between room temperature and 400° C.

After the process gas 44 has passed over the glass substrates 12 for a given period of time at a desired temperature range, a desired gas concentration, e.g. in the range of 0.2% to 50%, and a desired gas flow rate, the fans 46, 50 are switched off and the processing chamber 14 is evacuated.

While subsequently a sulphurous process gas, e.g. a $H_2S$-containing process gas, 44 is let into the processing chamber 14 by the gas inlet device 42, the fans 46, 50 are switched on again. The process temperature is increased further, e.g. to a temperature between 400° C. and 600° C., and kept on a predetermined temperature for a predetermined period. At the same time the desired gas flow rate and gas concentration are controlled, the latter e.g. within 0.2% and 50%.

Once heating is finished, the upper gas deflecting elements 54 are closed and the lower gas deflecting elements 56 are opened so that the process gas 44 is now conveyed through the cooling device 40 and the glass substrates 12 are cooled down to a temperature for example ranging from 350° C. to 150° C., for example 250° C.

Once the processing chamber 14 has been re-evacuated and filled with nitrogen, processing of the processed goods stack 66 is finished, so that the stack can be removed from the processing chamber 14.

The heating and cooling rates achievable with the processing device 10 and adjustable within a wide range, for example heating rates ranging from less than 1 K/min to 60 K/min and, depending on the design of the processing chamber 14, also above this, enable processing of the processed goods stack 66 in the processing chamber 14, i.e. in the present exemplary embodiment the selenisation and sulphurization of the process goods, in less than two hours.

It is basically possible to remove the processed goods stack 66 through the loading opening 60 at the front side 58 of the processing device 10.

In the present exemplary embodiment, the processing device 10, however, has at its reverse side 68 an unloading opening 70 made in the processing chamber wall 16, which, like the loading opening 60 can be locked by means of a plate valve 72 or another suitable gate. Equipping the processing device 10 with a loading opening 60 and an opposite unloading opening 70 has the advantage that the processing device 10 can be used as a run-through device and be coupled with further processing devices.

Figure 3:
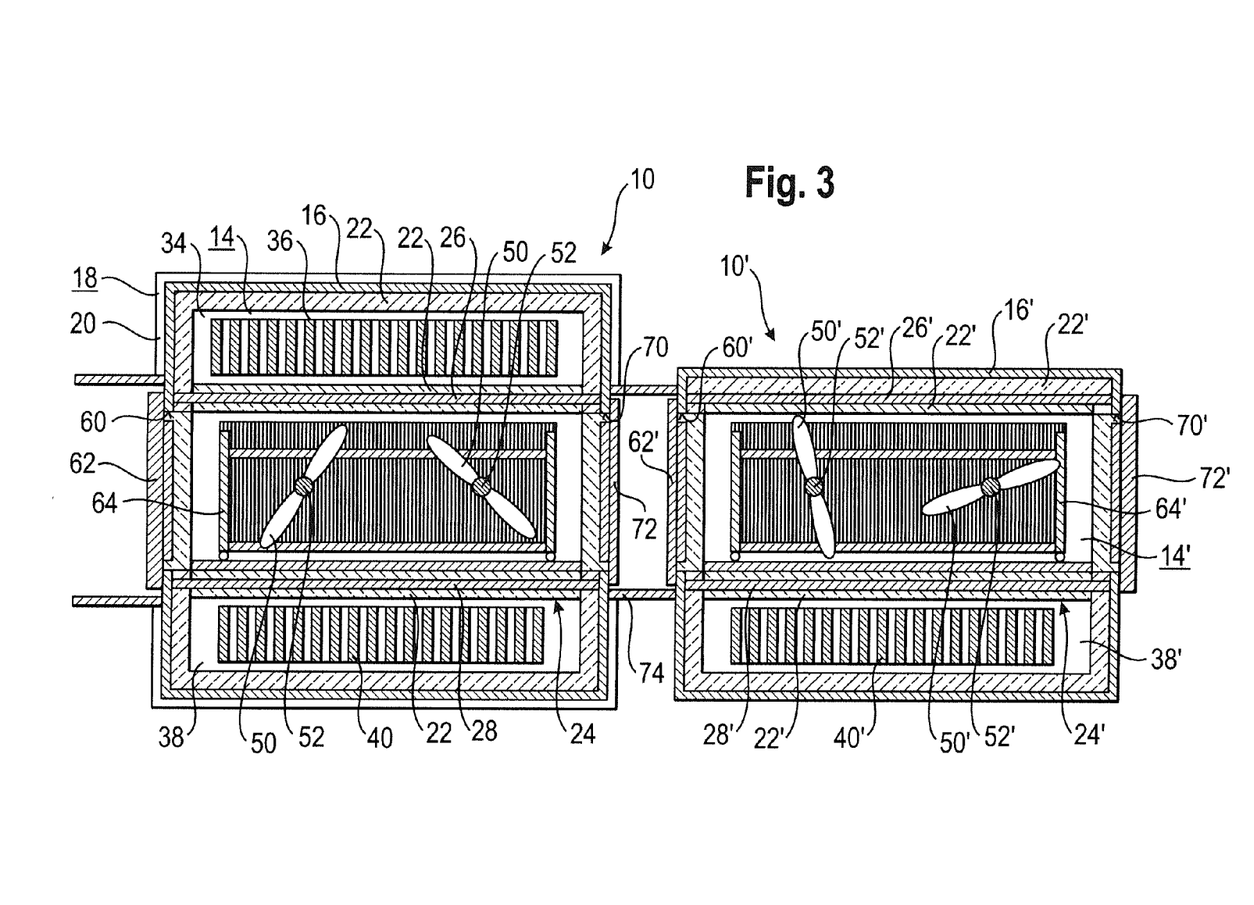
FIG. 3 is a schematic longitudinal section view of a processing system according to the invention, comprising a processing device of the type shown in FIGS. 1 and 2 and a cooling device arranged beside it.

FIG. 3, for example, shows a processing system comprising a processing device 10 and a cooling device 10' connected to it on the output side. The cooling device 10' is formed similarly to the processing device 10, the only difference being that the upper chamber area 34 with the heating device 36 is omitted. Since the cooling device 10' is provided exclusively for cooling the glass substrates 12 and a cooling gas, particularly an inert gas, such as nitrogen gas, is to run only through the gas guiding device 24' and the lower chamber area 38' comprising the cooling device 40', the upper and lower gas deflecting elements 54, 56 are also omitted. For the sake of clarity, FIG. 3 does not show any second distributing devices 32.

The cooling device 10' is coupled with the processing device 10 via a coupling section 74 and arranged beside it so that a loading opening 60' of the cooling device 10' is in alignment with the unloading opening 70 of the processing device 10. The loading opening 60' of the cooling device 10' can be opened and closed by means of a plate valve 62' simultaneously with or independently of the unloading opening 70 of the processing device 10.

The serial arrangement of the processing device 10 and the cooling device 10' allows to move the processed goods stack 66 in the processing device 10 through the unloading opening 70 and the loading opening 60' into the cooling device 74 once processing is finished.

As soon as the processed goods stack 66 has been moved into the cooling device 10', the plate valve 72 is locked again and the processing device 10 is loaded with another processed goods stack 66.

At the same time, the first processed goods stack 66, which is now in the cooling device 10', can be cooled still further, e.g. to 80° C., by causing the fans 50' to run circulating nitrogen gas past the glass substrates 12 and through the cooling device 40'. After a final evacuation and a last loading of the cooling device 10 the processed goods stack 66' can be removed from the cooling device 10' through an unloading opening 70'. The cooling device 10' is now ready for receiving the next processed goods stack 66 from the processing device 10.

Figure 4:
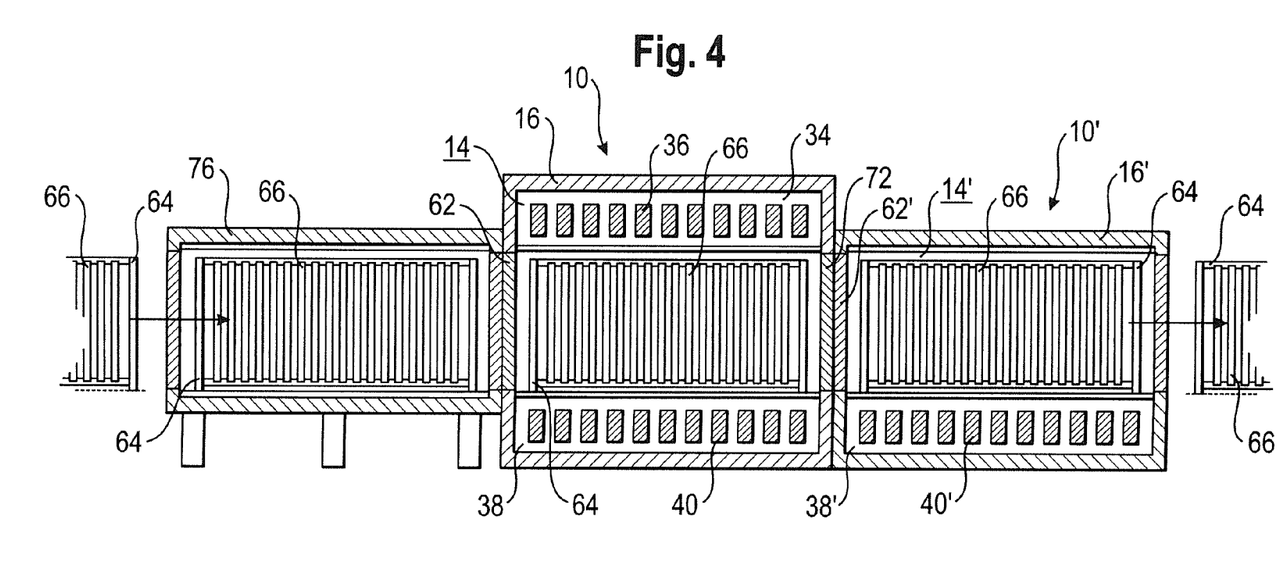
FIG. 4 is a schematic longitudinal section view of another alternative embodiment of a processing system according to the invention, comprising a channeling chamber upstream of the processing device and a cooling device downstream of the processing device.

As shown in FIG. 4, a channeling chamber 76 can be arranged upstream of the processing device 10 to prevent the ambient atmosphere from penetrating into the processing chamber 14 during the loading of the processing device 10 with a processed goods stack 66.

Furthermore, a transportation mechanism for moving the carrier 64 carrying the processed goods stack 66 through the processing system can comprise a feeding mechanism for sliding the carrier 64 and the processed goods stack 66 from the channeling chamber 76 into the processing chamber 14 as well as a pulling out mechanism for pulling the carrier 64 and the processed goods stack 66 out of the processing chamber 14 into the cooling device 10'. In this way, it is possible to prevent the movable parts of the transportation mechanism from contacting the hot and corrosive areas of the processing system.

By means of the run-through badge processing, also called inline batch processing, it is possible to form the desired chalcopyrit semiconducting thin layers on the glass substrates 12 within a total cycle period of clearly less than two hours.

The features of the invention disclosed in this description, in the claims as well as in the drawings can be essential, both individually as well as in any arbitrary combination, for the realization of the invention in its various embodiments.

The invention claimed is:

1. A processing device for processing stacked processed goods in the form of planar substrates for the production of conducting, semiconducting, or insulating thin layers, the processing device comprising:
    an evacuatable process chamber that receives a process gas, wherein the process gas, when received in the evacuatable process chamber, reacts with stacked processed goods inside the evacuatable process chamber;
    a tempering device that is, at least in sections:
    in a wall of the evacuatable process chamber; and/or
    attached to an external surface of the wall of the evacuatable process chamber,
    wherein the tempering device keeps at least a partial region of the wall of the evacuatable process chamber at a predetermined first temperature during at least part of the processing of the stacked processed goods, wherein the first temperature is not below a second temperature that is room temperature, wherein the first temperature is below a third temperature that is generated in the evacuatable process chamber, the third temperature being above room temperature, and wherein an inner surface of the wall is covered at least in sections with a thermal insulating material that is resistant to corrosion from the process gas received in the evacuatable process chamber;
    a gas conveying device disposed inside the evacuatable process chamber, wherein the gas conveying device includes a corrosion-resistant material and creates a circulating gas flow within the evacuatable process chamber such that the process gas received in the evacuatable process chamber flows along a looped path and at least a part of the circulating gas flow provides a forced convection;
    a heating device that heats the process gas, wherein the heating device is disposed inside the evacuatable process chamber with the gas conveying device, in the circulating gas flow created by the gas conveying device;
    a gas guiding device that receives the stacked processed goods, wherein the gas guiding device is disposed inside the evacuatable process chamber with the gas conveying device and the heating device such that at least part of the circulating gas flow that is created extends through the gas guiding device and a surface of the gas guiding device helps direct the circulating gas flow;
    a first loading opening that is lockable with a first locking device that is gas and/or vacuum tight, wherein the stacked processed goods are insertable through the first loading opening into the gas guiding device; and
    a gas inlet device that feeds the process gas into the circulating gas flow,
    wherein the gas conveying device comprises a fan that has a corrosion-resistant material, and
    wherein the wall of the evacuatable process chamber comprises a metal or metal alloy.

2. A processing device according to claim 1, wherein surfaces of the gas guiding device are covered with a thermal insulating material that is resistant to corrosion from the process gas received in the evacuatable process chamber.

3. A processing device according to claim 1, wherein the gas guiding device has at least a distribution device that distributes the process gas, and wherein the stacked processed goods are positioned downstream from the distribution device.

4. A processing device according to claim 3, wherein the distribution device distributes the process gas in a uniform way.

5. A processing device according to claim 3, wherein the distribution device is a plate having slits and/or holes.

6. A processing device according to claim 1, wherein the gas inlet device is resistant to corrosion from a sulfur-containing or selenium-containing process gas that is fed into the circulating gas flow.

7. A processing device according to claim 6, wherein the gas inlet device is resistant to corrosion from $H_2S$-containing and/or $H_2Se$-containing gas, or gaseous sulfur and/or gaseous selenium, that is fed into the circulating gas flow.

8. A processing device according to claim 1, wherein the heating device includes at least one corrosion-resistant heating element.

9. A processing device according to claim 8, wherein the at least one corrosion-resistant heating element comprises graphite or silicon carbide resistive heating elements.

10. A processing device according to claim 9, wherein the graphite or silicon carbide resistive heating elements are plate-shaped meander heating stacks or bundles of heating rods.

11. A processing device according to claim 1, further comprising a cooling unit that is arranged inside the circulating gas flow, wherein the cooling unit is temperature-controllable within a range from room temperature to 250° C.

12. A processing device according to claim 11, further comprising gas deflecting elements through which the circulating gas flow is deflected in such a way that either the heating device or the cooling unit is disposed in the circulating gas flow.

13. A processing device according to claim 11, wherein the cooling unit comprises at least one cooling element, a plate stack cooler, and/or a rod bundle cooler.

14. A processing device according to claim 1, further comprising a first unloading opening that is lockable with a second locking device that is gas and/or vacuum tight, wherein the stacked processed goods are removable through the first unloading opening from the gas guiding device.

15. A processing device according to claim 14, wherein the first locking device and/or the second locking device comprise metal or metal alloys.

16. A processing device according to claim 15, wherein the first locking device and/or the second locking device comprise stainless steel or a stainless steel alloy.

17. A processing device according to claim 14, wherein the first and/or second locking device are temperature-controllable by the tempering device of the evacuatable process chamber in such a way that at least a partial region of the locking device is adjustable to the predetermined first temperature during at least part of the processing of the stacked processed goods, wherein the first temperature is not below the second temperature, and wherein the first temperature is below the third temperature.

18. A process system for processing stacked processed goods, comprising:
  (a) a processing device according to claim 14; and either or both of:
  (b) a cooling device comprising a cooling chamber with a second loading opening that is lockable with a third locking device that is gas and/or vacuum tight, and a second unloading opening that is lockable with a fourth locking device that is gas and/or vacuum tight, wherein the first unloading opening and the second loading opening are positioned adjacently in order to transfer the stacked processed goods from the processing device into the cooling device; and/or
  (c) a channeling device comprising a channeling chamber with a third loading opening that is lockable with a fifth locking device that is gas and/or vacuum tight, and a third unloading opening that is lockable with a sixth locking device that is gas and/or vacuum tight, wherein the third unloading opening and the first loading opening are positioned adjacently in order to transfer the stacked processed goods from the channeling chamber into the processing device.

19. A process system according to claim 18, further comprising at least one first connecting section that is coupled with the first unloading opening of the processing device and with the second loading opening of the cooling device, and/or at least one second connecting section that is coupled with the first loading opening of the processing device and with the third unloading opening of the channeling chamber.

20. A process system according to claim 19, wherein the tempering device is in thermal operative connection with at least one wall of the channeling chamber, the cooling chamber, the first connecting section, or the second connecting section.

21. A process system according to claim 18, wherein the cooling device comprises at least one cooling unit in the cooling chamber, wherein the cooling unit is temperature-controllable in a range from −196° C. 250° C. and comprises at least one cooling element and/or one plate stack cooler and/or one rod bundle cooler.

22. A process system according to claim 18, wherein the channeling chamber has at least one heating device.

23. A process system according to claim 18, wherein at least two processing devices according to claim 1 are connected with each other, directly or using a third connecting section, via their respective unloading and loading openings.

24. A process system according to claim 18, wherein a wall of the cooling chamber and/or the channeling chamber comprises metal or metal alloys.

25. A processing system according to claim 24, wherein the wall of the cooling chamber and/or the channeling chamber comprises stainless steel or a stainless steel alloy.

26. A processing device according to claim 1, wherein parts of the processing device located inside the evacuatable process chamber contain metal, metal alloys, or ceramic or carbonic or carbon fiber materials.

27. A processing device according to claim 1, wherein a cross-section of the evacuatable process chamber is, at least in sections, substantially rectangular, quadratic, trapezoidal, or triangular.

28. A processing device according to claim 1, further comprising at least one exhaust unit that includes at least one exhaust port for evacuating the evacuatable process chamber.

29. A processing device according to claim 1, wherein the at least one wall of the evacuatable process chamber comprises stainless steel or a stainless steel alloy.

30. A processing device according to claim 1, wherein the gas guiding device has at least an upper dividing plate defining a first chamber section in the evacuatable process chamber above the gas guiding device, and a lower dividing plate defining a second chamber section in the evacuatable process chamber below the gas guiding device.

31. A processing device according to claim 1, wherein the gas guiding device has one or more dividing plates at a side.

32. A processing device according to claim 1, wherein the fan is positioned in an area of a first side of the stacked processed goods and/or is attached to a transmission drive that extends into the evacuatable process chamber.

33. A processing device according to claim 32, wherein at least one further fan is positioned in the area of an opposing second side of the stacked processed goods.

34. A method for processing stacked and/or planar processed goods for the production of conducting, semiconducting, or insulating thin layers, the method comprising:
  inserting the stacked and/or planar processed goods into a gas guiding device during a processing phase, wherein the gas guiding device has one or more dividing plates at a side and is arranged inside a gas-receiving process chamber, wherein an inner surface of a wall of the gas-receiving process chamber is covered at least in sections with a thermal insulating material that is resistant to corrosion from the gas received in the gas-receiving process chamber, and wherein the wall of the gas-receiving process chamber comprises a metal or metal alloy;
  utilizing a tempering device that is attached to an external surface of at least a partial region of the wall of the gas-receiving process chamber at least during part of the processing of the stacked and/or planar processed goods, wherein the tempering device holds the wall at a predetermined first temperature, wherein the first temperature is not below a second temperature that is room temperature, and wherein the first temperature is below a third temperature that is generated in the gas-receiving process chamber at least during intervals during the processing, wherein the third temperature is above room temperature;
  creating a circulating gas flow within the gas-receiving process chamber utilizing a gas conveying device disposed inside the gas-receiving process chamber with the gas guiding device such that the gas received in the gas-receiving process chamber flows along a looped path and at least a part of the circulating gas flow provides a forced convection that extends through the gas guiding device, wherein the gas conveying device comprises a fan that has a corrosion-resistant material, and
heating the gas utilizing a heating device arranged inside the gas-receiving process chamber with the gas conveying device in the circulating gas flow.

35. A method according to claim 34, further comprising feeding a sulfur-containing or selenium-containing gas through a gas inlet device into the gas-receiving process chamber during a processing phase.

36. A method according to claim 35, wherein a $H_2S$, $H_2Se$ gas, gaseous sulfur, and/or gaseous selenium is fed through the gas inlet device into the gas-receiving process chamber during the processing phase.

37. A method according to claim 34, wherein the stacked and/or planar processed goods inserted into the gas guiding device comprise planar, pre-coated glass substrates suitable to manufacture semiconductor thin layers.

38. A method according to claim 37, wherein the stacked and/or planar processed goods inserted into the gas guiding device comprise planar, pre-coated glass substrates suitable to manufacture chalcopyrite semiconductor layers.

39. A method according to claim 37, wherein the stacked and/or planar processed goods inserted into the gas guiding device comprise planar, pre-coated glass substrates suitable to manufacture 1-111-VI-compound semiconductor layers.

40. A method according to claim 37, wherein the stacked and/or planar processed goods inserted into the gas guiding device comprise planar, pre-coated glass substrates suitable to manufacture $Cu(In,Ga)(Se,S)_2$-semiconductor layers.

41. A method according to claim 37, wherein the stacked and/or planar processed goods inserted into the gas guiding device comprise planar, pre- coated glass substrates suitable to manufacture semiconductor thin layers for solar cells.

42. A method according to claim 34, wherein the first temperature is held, utilizing the tempering device, during processing in a range from room temperature to about 250° C.

43. A method according to claim 42, wherein the first temperature is held, utilizing the tempering device, during processing in a range from room temperature to 200° C.

44. A method according to claim 34, wherein the stacked and/or planar processed goods are substrates, the method further comprising utilizing the substrates to manufacture conducting, semiconducting, or insulating thin layers, or pre-stages or intermediates of said thin layers.

45. A method according to claim 44, further comprising manufacturing a chalcopyrite semiconductor thin layer, or a pre-stage or intermediate of said chalcopyrite semiconductor thin layer.

46. A method according to claim 45, wherein the chalcopyrite semiconductor thin layer is a CIS or CIGS semiconductor thin layer.

47. A method according to claim 34, wherein the stacked and/or planar processed goods are inserted into the gas guiding device through a first loading opening lockable with a first locking device that is gas and/or vacuum tight, the method further comprising:
removing the stacked and/or planar processed goods through a first unloading opening lockable with a second locking device that is gas and/or vacuum tight; and either one or both of:
(a) positioning a second loading opening of a cooling device comprising at least one cooling chamber lockable with a third locking device that is gas and/or vacuum tight, wherein the second loading opening is positioned adjacent to the first unloading opening;
transferring the stacked and/or planar processed goods from the gas guiding device into the cooling chamber of the cooling device; and
removing the stacked and/or planar processed goods from the cooling chamber through a second unloading opening lockable with a fourth locking device that is gas and/or vacuum tight; and/or
(b) providing at least one channeling device having a third loading opening lockable with a fifth locking device that is gas and/or vacuum tight;
positioning a third unloading opening lockable with a sixth locking device that is gas and/or vacuum tight, wherein the third unloading opening is positioned adjacent to the first loading opening; and
transferring the stacked and/or planar processed goods from the channeling device into the gas guiding device.

48. A method according to claim 34, further comprising positioning the fan in a side area of the stacked processed goods and/or attaching the fan to a transmission drive that extends into the gas-receiving process chamber.

49. A method for processing stacked and/or planar processed goods, comprising:
inserting the stacked and/or planar processed goods into a gas guiding device during a processing phase, wherein the gas guiding device has one or more dividing plates at a side and is arranged inside a gas-receiving process chamber, wherein an inner surface of a wall of the gas-receiving process chamber is covered at least in sections with a thermal insulating material that is resistant to corrosion from the gas received in the gas-receiving process chamber, and wherein the wall of the gas-receiving process chamber comprises a metal or metal alloy;
utilizing a tempering device to hold at least a partial region of the wall of the gas-receiving process chamber at a predetermined temperature;
creating a circulating gas flow within the gas-receiving process chamber such that the gas received in the gas-receiving process chamber flows along a looped path in the gas-receiving process chamber and at least a part of the circulating gas flow provides a forced convection that extends through the gas guiding device, wherein the circulating gas flow is created at least in part by utilizing a fan that has a corrosion-resistant material; and
heating the gas utilizing a heating device arranged inside the gas-receiving process chamber with the gas guiding device in the circulating gas flow.

50. A method according to claim 49, further comprising positioning the fan in a side area of the stacked processed goods and/or attaching the fan to a transmission drive that extends into the gas-receiving process chamber.

* * * * *